United States Patent
Trummer-Sailer et al.

(10) Patent No.: US 10,403,842 B2
(45) Date of Patent: Sep. 3, 2019

(54) LIGHT-EMITTING COMPONENT AND METHOD FOR PRODUCING A LIGHT-EMITTING COMPONENT

(71) Applicant: OSRAM OLED GmbH, Regensburg (DE)

(72) Inventors: Evelyn Trummer-Sailer, Mintraching (DE); Richard Baisl, Regensburg (DE); Dominik Pentlehner, Regensburg (DE); Arne Fleissner, Regensburg (DE); Nina Riegel, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/525,600

(22) PCT Filed: Nov. 2, 2015

(86) PCT No.: PCT/EP2015/075452
§ 371 (c)(1),
(2) Date: May 10, 2017

(87) PCT Pub. No.: WO2016/074970
PCT Pub. Date: May 19, 2016

(65) Prior Publication Data
US 2017/0331064 A1 Nov. 16, 2017

(30) Foreign Application Priority Data
Nov. 11, 2014 (DE) .................. 10 2014 222 920

(51) Int. Cl.
*H01L 51/50* (2006.01)
*H01L 51/52* (2006.01)
(Continued)

(52) U.S. Cl.
CPC .......... *H01L 51/504* (2013.01); *H01L 27/322* (2013.01); *H01L 51/107* (2013.01);
(Continued)

(58) Field of Classification Search
CPC ..... H01L 2251/5315; H01L 2933/0041; H01L 33/50; H01L 33/52; H01L 51/5036; H01L 51/5256; H01L 51/5268; H01L 51/5275
(Continued)

(56) References Cited

U.S. PATENT DOCUMENTS 6,586,874 B1 * 7/2003 Komoto ............... G02B 6/0023
257/100
9,740,073 B2 * 8/2017 Oh ........................ G02F 1/153
(Continued)

FOREIGN PATENT DOCUMENTS

DE 102007052181 A1 4/2009
DE 102011005612 A1 9/2012
(Continued)

OTHER PUBLICATIONS

German Search Report based on application No. 10 2014 222 920.0 (7 pages) dated Sep. 29, 2015 (for reference purpose only).
International Search Report based on application No. PCT/EP2015/075452 (16 pages) dated Feb. 1, 2016 (Reference Purpose Only).

*Primary Examiner* — Edward Chin
(74) *Attorney, Agent, or Firm* — Viering, Jentschura & Partner MBB

(57) ABSTRACT

A light-emitting component is provided including a functional layer stack having at least one light-emitting layer which is set up to generate light during the operation of the component, a first electrode and a second electrode, which are set up to inject charge carriers into the functional layer stack during operation, and an encapsulation arrangement having encapsulation material, which is arranged above at least one of the electrodes and the functional layer stack. At
(Continued)

least one of the electrodes is transparent and contains a wavelength conversion substance and/or the encapsulation material is transparent and contains a wavelength conversion substance.

13 Claims, 4 Drawing Sheets

(51) Int. Cl.
  *H01L 27/32* (2006.01)
  *H01L 51/10* (2006.01)
  *H01L 51/44* (2006.01)

(52) U.S. Cl.
  CPC ........ *H01L 51/442* (2013.01); *H01L 51/5206* (2013.01); *H01L 51/5234* (2013.01); *H01L 51/5253* (2013.01); *H01L 51/5092* (2013.01); *H01L 51/5275* (2013.01); *H01L 2251/5315* (2013.01); *H01L 2251/5323* (2013.01); *H01L 2251/5346* (2013.01); *H01L 2251/5369* (2013.01)

(58) Field of Classification Search
  USPC .......................................... 313/512; 445/51
  See application file for complete search history.

(56) References Cited

U.S. PATENT DOCUMENTS

| | | | |
|---|---|---|---|
| 9,797,567 B2 * | 10/2017 | Kastner-Jung | B60Q 3/745 |
| 2007/0080361 A1 | 4/2007 | Malm | |
| 2007/0085086 A1 | 4/2007 | Gohara et al. | |
| 2008/0042552 A1 | 2/2008 | Cok | |
| 2008/0297878 A1 * | 12/2008 | Brown | B82Y 10/00 |
| | | | 359/263 |
| 2009/0091258 A1 * | 4/2009 | Heuser | H01L 33/50 |
| | | | 313/512 |
| 2012/0091923 A1 | 4/2012 | Kastner-Jung et al. | |
| 2012/0320607 A1 | 12/2012 | Kinomoto et al. | |
| 2016/0233455 A1 * | 8/2016 | Riedel | H01L 51/5203 |
| 2016/0266459 A1 * | 9/2016 | Oh | G02F 1/153 |

FOREIGN PATENT DOCUMENTS

| | | | | |
|---|---|---|---|---|
| DE | 102011111917 A1 | 2/2013 | | |
| DE | 102011113777 A1 | 3/2013 | | |
| EP | 1770794 A2 | 4/2007 | | |
| EP | 2040316 A1 * | 3/2009 | ........ | H01L 51/5036 |
| EP | 2544253 A1 | 1/2013 | | |
| WO | 2010066245 A1 | 6/2010 | | |
| WO | 2014062135 A1 | 4/2014 | | |
| WO | 2014128559 A1 | 8/2014 | | |

\* cited by examiner

LIGHT-EMITTING COMPONENT AND METHOD FOR PRODUCING A LIGHT-EMITTING COMPONENT

RELATED APPLICATIONS

The present application is a national stage entry according to 35 U.S.C. § 371 of PCT application No.: PCT/EP2015/075452 filed on Nov. 2, 2015, which claims priority from German application No.: 10 2014 222 920.0 filed on Nov. 11, 2014, and is incorporated herein by reference in its entirety.

TECHNICAL FIELD

A light-emitting component and a method for producing a light-emitting component are specified.

BACKGROUND

In order to adjust the emission color of an organic light-emitting diode (OLED), a luminescent substance is used to modify the emitted spectrum of the OLED. Luminescent substances can be applied, for example, in the form of films.

It is also known from document EP 2 040 316 A1 to integrate luminescent layers which are formed by a luminescent substance in a plastic material, in an encapsulation of an OLED in such a way that barrier layers and luminescent layers alternate.

SUMMARY

It is at least one object of specific embodiments to specify a light-emitting component having a wavelength conversion substance. At least a further object of specific embodiments is to specify a method for producing a light-emitting component.

These objects are achieved by a subject matter and a method according to the independent patent claims. Advantageous embodiments and further extensions of the subject matter and the method are characterized in the dependent claims and also emerge from the following description and the drawings.

According to at least one embodiment, a light-emitting component includes a functional layer stack containing at least one light-emitting layer which is set up to generate light during the operation of the component. In addition, the component includes a first electrode and a second electrode, which are set up to inject charge carriers into the functional layer stack during operation. In particular, one of the electrodes can be implemented as an anode and the other electrode as a cathode, each of which inject holes or electrons, in particular from different sides, into the at least one light-emitting layer. By a recombination of holes and electrons, light can be generated in the light-emitting layer by electro-luminescence during the operation of the component.

In accordance with a further embodiment, the light-emitting component includes an encapsulation arrangement, which includes an encapsulation material. The encapsulation arrangement can be arranged in particular above at least one of the electrodes, advantageously above both of the electrodes, and the functional layer stack. The encapsulation material is suitable for protecting the functional layer stack and at least one of the first and second electrodes, advantageously both electrodes, against harmful substances from the environment, such as moisture, oxygen and/or hydrogen sulfide.

In accordance with a further embodiment, the light-emitting component includes at least one layer, which is transparent and contains a wavelength conversion substance. The transparent layer having the wavelength conversion substance is selected in particular from the electrodes and at least one encapsulation layer of the encapsulation arrangement. The wavelength conversion substance is embedded in the transparent layer containing the wavelength conversion substance. This means that the layer substantially includes a functional material or is formed thereby, which material determines the functionality of the layer and is transparent and in which the wavelength conversion substance is embedded. If the layer having the wavelength conversion substance is an electrode, then the wavelength conversion substance is embedded in an electrode material, i.e. an electrically conductive material.

If the layer having the wavelength conversion substance is an encapsulation layer of the encapsulation arrangement, then the wavelength conversion substance is embedded in an encapsulation material, i.e. a material that represents a barrier or a partial barrier against harmful substances from the environment. The light-emitting component may therefore include at least one electrode that is transparent and contains a wavelength conversion substance, and/or an encapsulation layer with a transparent encapsulation material and contains a wavelength conversion substance. In other words, this means that the light-emitting component includes at least one electrode and/or at least one encapsulation layer, which is also designed as a wavelength conversion layer. In the case of the light-emitting component described here therefore, it can in particular be possible that it unlike in the prior art it is not necessary to use an additional wavelength conversion layer to control the light spectrum emitted by the component.

The fact that the wavelength conversion substance is embedded in the functional material of the transparent layer concerned can mean, in particular, that the functional material surrounds and encloses the wavelength conversion substance. The functional material can thus form a kind of matrix material for the wavelength conversion substance.

For example, the wavelength conversion substance may include particles in the functional material of the transparent layer, for example in the form of a luminescent material or in the form of so-called quantum dots. For the case whereby the wavelength conversion substance includes organic molecules, the wavelength conversion substance can also chemically bonded to the functional material. If the encapsulation material contains a wavelength conversion substance, then this can be encapsulated in particular by the encapsulation material and thus be protected by the encapsulation material against harmful environmental influences. The same can also apply to the case whereby a wavelength conversion substance is embedded in an electrode material.

Accordingly it may be possible to protect converter materials that are sensitive to external influencing factors such as moisture, light and/or oxygen, against these harmful environmental influences by means of the embedding. For example, this can be advantageous in the case whereby quantum dots are used as the wavelength conversion substance, since with regard to the above-mentioned environmental influences these may only have a low stability.

Here and hereafter, the term "transparent" designates a layer that can also be a sequence of layers and that is at least partially transparent to visible light, in particular for light that is generated in the light emitting layer during operation of the component. Such a transparent layer can either be fully transparent or else at least partially light-diffusing and/or partially light-absorbing, so that what is designated a transparent layer can also be, for example, appear diffuse or milky and therefore can be translucent.

In accordance with a further embodiment in a method for producing a light-emitting component during the formation of at least one transparent layer, which is selected from at least one of the electrodes and at least one encapsulation layer of the encapsulation arrangement, a wavelength conversion substance is embedded into a functional material of the layer. In other words, the wavelength conversion substance is applied together with the functional material of the relevant layer, which means the wavelength conversion substance is directly embedded into the transparent layer. The functional material can accordingly be an electrode material or an encapsulation material. The wavelength conversion substance is located directly in the material that has the characteristic properties of the transparent layer, in the case of an electrode therefore, said substance is embedded in an electrically conductive, hole-injecting or electron-injecting material and in the case of an encapsulation layer it is embedded in a material which can form a barrier or a partial barrier against environmental gases.

The embodiments and features described above and hereafter refer in equal measure to the light-emitting component and to the method for producing the light-emitting component.

In accordance with a further embodiment, the encapsulation arrangement is embodied in the form of a thin film encapsulation. An encapsulation arrangement designed as a thin film encapsulation is in the present case defined as a device which is suitable for forming a barrier against atmospheric substances, in particular against moisture and oxygen and/or other harmful substances, such as corrosive gases, for example hydrogen sulfide. In other words, the thin film encapsulation is designed in such a way that it can be penetrated by atmospheric substances in only very low amounts. This barrier effect in the thin-film encapsulation is substantially produced by encapsulation layers designed as thin layers, which are either part of the encapsulation arrangement or else form the encapsulation arrangement.

The encapsulation layers can be applied, for example, by means of an atomic layer deposition (ALD) process or a molecular layer deposition (MLD) process. Encapsulation layers of the encapsulation arrangement thus produced usually have a thickness of less than or equal to a few 100 nm. Advantageously, the encapsulation arrangement includes a layer sequence having a plurality of thin encapsulation layers, each of which can have a thickness of greater than or equal to one atomic layer or greater than or equal to 1 nm, or greater than or equal to 5 nm and less than or equal to 100 nm, or less than or equal to 70 nm or less than or equal to 50 nm or less than or equal to 20 nm or less than or equal to 10 nm. Suitable materials for the encapsulation layers of the encapsulation arrangement are oxides, nitrides or oxinitrides, for example, aluminum oxide, zinc oxide, zirconium oxide, titanium oxide, hafnium oxide, lanthanum oxide, tantalum oxide.

Alternatively or in addition to encapsulation layers produced using ALD or MLD, the encapsulation arrangement may include at least one or a plurality of additional layers, i.e. in particular barrier layers and/or passivation layers, which are deposited by thermal evaporation, by means of a plasma-assisted process, such as sputtering or plasma-enhanced chemical vapor deposition (PECVD), or by means of plasma-free vapor phase deposition, such as chemical vapor deposition (CVD).

Suitable materials for this are the materials already mentioned in connection with ALD and MLD, and silicon nitride, silicon oxide, silicon oxinitride, indium tin oxide, indium zinc oxide, aluminum-doped zinc oxide, and mixtures and alloys of those materials. The one or the plurality of additional layers can for example each have a thickness of greater than or equal to 1 nm and less than or equal to 20 µm or is less than or equal to 10 µm or less than or equal to 1 µm or less than or equal to 500 nm.

In the event that the encapsulation arrangement contains a wavelength conversion substance, the encapsulation arrangement is advantageously designed as a thin-film encapsulation having at least one encapsulation layer of an oxide, nitride or oxinitride, in particular one or a plurality of the above listed materials, as the encapsulation material, wherein the wavelength conversion substance is embedded in the encapsulation material of the encapsulation layer. In the case of a wavelength conversion substance in the form of particles, the encapsulation layer advantageously has a thickness of greater than or equal to the size of the conversion substance particles. In addition, the thin film encapsulation may also include a plurality of encapsulation layers, in which particles are embedded accordingly. In this case a plurality of encapsulation layers taken individually can each have a thickness greater than or equal to the size of the conversion substance particles, so that particles of a wavelength conversion substance are embedded in each of the relevant encapsulation layers. It can also be possible that a plurality of encapsulation layers, each taken individually, are thinner than the size of the particles, but the plurality of encapsulation layers taken together have a thickness that is greater than or equal to the size of the particles.

In accordance with a further embodiment the light-emitting component is designed as an organic light-emitting component, having a substrate on which the electrodes, the functional layer stack and the encapsulation arrangement are arranged. In particular, the first electrode can be arranged on the substrate with the functional layer stack above it, the second electrode above that and the encapsulation arrangement above that. At least one of the first and second electrode is transparent. The functional layer stack is in this case designed as an organic functional layer stack and includes at least one organic light-emitting, electroluminescent layer. The organic light-emitting component can be designed in particular as an organic light-emitting diode (OLED).

The organic functional layer stack may include layers having organic polymers, organic oligomers, organic monomers, organic small, non-polymer molecules ("small molecules") or combinations thereof. In particular it can be advantageous if the organic functional layer stack includes a functional layer which is implemented as a hole transport layer, in order to facilitate an effective injection of holes into the light-emitting layer. Materials that have proved advantageous for a hole transport layer can be, for example, tertiary amines, carbazol derivatives, conductive polyaniline or polyethylene dioxythiophene. Suitable materials for the light-emitting layer are materials that exhibit radiation emission due to fluorescence or phosphorescence, for example polyfluorene, polythiophene or polyphenylene, or derivatives, compounds, mixtures or copolymers thereof. Furthermore, the organic functional layer stack may include a functional layer which is implemented as an electron transport layer. In addition, the layer stack may also include electron-blocking and/or hole-blocking layers. The organic functional layer stack may also include a plurality of organic light-emitting layers which are arranged between the electrodes.

With regard to the basic structure of an organic light-emitting component, for example with regard to the structure, the layer composition and the materials of the organic functional layer stack, reference is made to document WO 2010/066245 A1, which in particular in relation to the structure of an organic light-emitting component is explicitly incorporated by reference.

In accordance with a further embodiment, the substrate includes one or more of materials in the form of a layer, a plate, a film or a laminate, which are selected from glass, quartz, plastic, metal, and silicon wafer. In the case of a transparent substrate, this advantageously includes or else is made of glass or a transparent plastic, for example in the form of a glass layer, glass film, plastic film, plastic plate or glass plate. In the case of a non-transparent substrate this may include or else be made of an opaque plastic, an opaque glass or a metal, such as an opaque plastic film or plate, an opaque glass film or plate, or a metal foil. For the case where the substrate includes or else is made of plastic, it can be advantageous if viewed from the functional layer stack a further encapsulation arrangement is arranged on the substrate side of the component, which can be designed in the same way as the encapsulation arrangement previously described. The additional encapsulation arrangement can be arranged, for example, between the first electrode and the substrate and/or on the opposite side of the substrate to the first electrode. It is also possible in this case that the additional encapsulation arrangement includes at least one transparent encapsulation layer, which as described above contains a wavelength conversion substance.

In accordance with a further embodiment, the substrate and the first electrode arranged between the substrate and the functional layer stack are transparent, so that light generated in the light-emitting layer can be emitted through the transparent first electrode and the substrate. An organic light-emitting component of this kind can also be designated as a so-called "bottom emitter". In particular, the transparent first electrode can in this case contain a wavelength conversion substance, as described above. In the case of a component designed as a bottom emitter, the second electrode can be designed to be reflecting.

In accordance with a further embodiment, the encapsulation arrangement and the second electrode arranged above the functional layer stack, viewed from the substrate, are transparent, so that light generated in the light-emitting layer can be emitted through the transparent electrode and the encapsulation arrangement. An organic light-emitting component of this kind can also be designated as a so-called "top emitter". In particular, in this case the transparent second electrode and/or at least one encapsulation layer of the encapsulation arrangement can contain a wavelength conversion substance, as described above. In the case of a component designed as a top emitter, the second electrode can be designed to be reflecting.

In accordance with a further embodiment, the light-emitting component is designed simultaneously as both a bottom emitter and a top emitter and thus includes a transparent first electrode and a transparent second electrode that are arranged between a transparent substrate and a transparent encapsulation arrangement.

In particular, the light-emitting component in this case can be designed transparent. A wavelength conversion substance can in this case be contained on one or both sides, viewed from the light-emitting layer, i.e. in one or a plurality of layers selected from the first electrode, the second electrode and at least one encapsulation layer of an encapsulation arrangement, which when viewed from the substrate can be arranged above the second electrode or below the first electrode.

In accordance with a further embodiment, a transparently designed electrode includes a transparent conducting oxide or consists of a transparent conducting oxide as the functional material, i.e. the electrode material. Transparent conducting oxides (TCO) are transparent, conducting materials, in general, metal oxides, for example zinc oxide, tin oxide, cadmium oxide, titanium oxide, indium oxide or indium tin oxide (ITO). In addition to binary metal-oxygen compounds such as ZnO, SnO2 or In2O3, the group of TCOs also includes ternary metal-oxygen compounds, such as Zn2SnO4, CdSnO3, ZnSnO3, MgIn2O4, GaInO3, Zn2In2O5 or In4Sn3O12, or mixtures of different transparent conducting oxides. Furthermore, the TCOs do not necessarily need to conform to a stoichiometric composition, and can also be p-doped or n-doped. The electrode material can be applied, for example, by means of ALD, MLD, sputtering, or another method previously mentioned in connection with the encapsulation arrangement.

In accordance with a further embodiment a reflectively designed electrode includes a metal that can be selected from aluminum, barium, indium, silver, gold, magnesium, calcium and lithium and compounds, combinations and alloys thereof. In particular, the reflecting additional electrode may include Ag, Al or alloys with these, for example Ag:Mg Ag:Ca, Mg:Al.

In accordance with a further embodiment, the light-emitting component is designed as an inorganic light-emitting component, in which the functional layer stack is designed as an inorganic semiconductor layer sequence having at least one light-emitting layer. For example, the inorganic light-emitting component can be designed as an inorganic light-emitting semiconductor chip, such as an LED chip or laser diode chip. The inorganic light-emitting component, depending on the wavelength emitted, may include a semiconductor layer sequence on the basis of different semiconductor material systems. For a long-wavelength, infrared to red radiation, for example, a semiconductor layer sequence based on $In_xGa_yAl_{1-x-y}As$ is suitable, for red to yellow radiation, for example, a semiconductor layer sequence based on $In_xGa_yAl_{1-x}yP$ is suitable and for short-wave visible radiation, i.e. in particular in the range from green to blue light, and/or for UV radiation, for example, a semiconductor layer sequence based on $In_xGa_yAl_{1-x}yN$ is suitable, where in each case $0 \leq x \leq 1$ and $0 \leq y \leq 1$.

In particular, the inorganic light-emitting component may include an epitaxially grown semiconductor layer sequence. For this purpose the semiconductor layer can be grown by means of an epitaxy process, for example, metal-organic vapor phase epitaxy (MOVPE) or molecular beam epitaxy (MBE), on a growth substrate and be provided with electrical contacts in the form of the first and second electrode. Separating or sub-dividing the growth substrate with the grown semiconductor layer sequence enables a plurality of light-emitting components to be produced.

Furthermore, before the separation the semiconductor layer sequence can be transferred to a carrier substrate and the growth substrate can be made thinner or completely removed. Such semiconductor chips which as their substrate have a carrier substrate instead of the growth substrate, can also be designated as so-called thin-film semiconductor chips. The basic principle of a thin-film LED chip is described, for example, in the paper by I. Schnitzer et al., Appl. Phys. Lett. 63 (16), 18 Oct. 1993, pp. 2174-2176.

Particularly advantageously, a component designed as an inorganic light-emitting component may include an encapsulation arrangement having at least one encapsulation layer, in which a wavelength conversion substance is embedded.

In accordance with a further embodiment, the wavelength conversion substance includes at least one inorganic luminescent material, at least one organic luminescent material and/or a material formed by quantum dots.

For example, the wavelength conversion substance includes one or a plurality of the following materials: garnets doped with rare-earth metals, alkaline earth sulfides doped with rare-earth metals, thiogallates doped with rare-earth metals, aluminates doped with rare-earth metals, silicates, such as orthosilicates, doped with rare-earth metals, chlorosilicates doped with rare-earth metals, alkaline-earth silicon nitrides doped with rare-earth metals, aluminum nitrides doped with rare-earth metals and aluminum oxynitrides doped with rare-earth metals, silicon nitrides doped with rare-earth metals, SiAlONes. The wavelength conversion substance can be doped, for example, with one of the following activators: cerium, europium, terbium, praseodymium, samarium, manganese. Furthermore, the wavelength conversion substance can additionally or alternatively include an organic material, which can be selected from a group including the perylenes, fluoresceines, stilbene derivatives, porphyryine derivatives, phthalocyanine derivatives, benzopyrene, coumarin, rhodamines and azo dyes. The quantum dots may include or be formed of, for example, one or more of the following materials: GaAs, GaP, GaN, sulfides, such as ZnS or CdS, selenides, such as ZnSe or CdSe. The wavelength conversion substance may include suitable mixtures and/or combinations of the cited luminescent materials and quantum dots.

Luminescent materials contained in the wavelength conversion substance can be shaped in the form of particles, which can have a size of, for example, from 1 to 10 μm. If the wavelength conversion substance contains quantum dots or if the wavelength conversion substance is formed by such dots, then the quantum dots can have a size of greater than or equal to 1 nm or greater than or equal to 2 nm or greater than or equal to 5 nm and less than or equal to 50 nm or less than or equal to 20 nm or less than or equal to 10 nm. In particular, the quantum dots can have a size in the region of 10 mm, for example.

In accordance with a further embodiment the wavelength conversion substance is homogeneously distributed in the transparent layer containing the wavelength conversion material, i.e. for example in an electrode and/or in an encapsulation layer. In other words, this means that the wavelength conversion substance can have a substantially uniform concentration distribution within the transparent layer.

Alternatively, it is also possible for the wavelength conversion substance to have a concentration gradient. The wavelength conversion layer in this case can have, for example, a decreasing concentration or an increasing concentration with increasing distance from the light emitting layer of the functional layer stack within the transparent layer containing the wavelength conversion substance. It can also be possible for the wavelength conversion substance within the transparent layer to be homogeneous in only a partial region or a partial layer or to be arranged with a concentration gradient, while a remaining region or a remaining partial layer of the transparent layer is free of the wavelength conversion substance.

In accordance with a further embodiment the layer that contains a wavelength conversion substance, i.e., for example an electrode or an encapsulation layer, can be produced by using an ALD process, an MLD process or another process as cited above, such as a CVD process. For example, for producing the functional material of the relevant transparent layer containing the wavelength conversion substance, the wavelength conversion substance can be fed together with at least one starting material to a coating chamber in which the transparent layer with the wavelength conversion substance is produced. This can be the case in particular when an ALD process or MLD process is used, in which the different starting materials are alternately fed to the coating chamber. The wavelength conversion substance can be mixed with at least one of the starting materials, and thus embedded in the growing layer during the growth of the layer. It is also possible, by using a direct liquid injection (DLI) procedure, to produce a particle-shaped wavelength conversion substance in a liquid. By using a pulsed supply of a suitable carrier gas, such as helium, at a suitable pressure, the liquid can be converted together with the conversion substance particles into small droplets, which are then fed to the coating chamber. The DLI process can be carried out in combination with the ALD or MLD process, or in combination with another process, such as a CVD process, which is suitable for producing the layer with the wavelength conversion substance. The described procedures can be used to embed the wavelength conversion substance homogeneously in the transparent layer. It can also be possible, by appropriate adjustment of pulses, during which the wavelength conversion substance is fed to the coating chamber, to create a concentration gradient, such as a concentration decrease in the transparent layer.

In the light-emitting component described here it is possible to incorporate a wavelength conversion substance directly into a transparent electrode and/or a transparent encapsulation layer, which can therefore simultaneously fulfill the function of a wavelength conversion layer. Due to the embedding it is possible to protect the luminescent materials from external influences such as moisture without separate encapsulation, which is advantageous in particular in the case of quantum dots, since the latter usually require an encapsulation. Since no separate process step is required for applying an additional converter layer, it is possible to reduce the process complexity and the production costs of the light-emitting component. Since the wavelength conversion substance exists as an optically integral constituent of the light-emitting component, a more appealing and higher-quality color impression of the component can be obtained in the switched-off state, in comparison to a component having an additional converter film. In particular in the case of an organic light-emitting component, so-called organic modes and substrate modes can also be used, i.e. light that is guided by total internal reflection within the organic functional layer stack or the substrate, since the wavelength conversion substance is arranged in a layer with a high refractive index. This can result in a higher conversion efficiency. Small quantities of a wavelength conversion substance can also often suffice, for example, to increase the "color rendering index" (CRI). This can be effected, for example, by increasing the red edge in the spectrum or by a gap in the emission spectrum of the functional layer stack being filled. In particular for the case where the wavelength conversion substance is embedded in the encapsulation arrangement, it is possible for the encapsulation arrangement, or at least an encapsulation layer having the wavelength conversion substance, to be applied only after the processing of the rest of the component. This makes it possible, by using an appropriate measurement of the emission spectrum of the functional layer stack, for the concentration of the wavelength conversion substance to be determined exactly based on the measurement data. This enables, for example, a finer binning to be achieved, or it is also possible to selectively change the color point.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
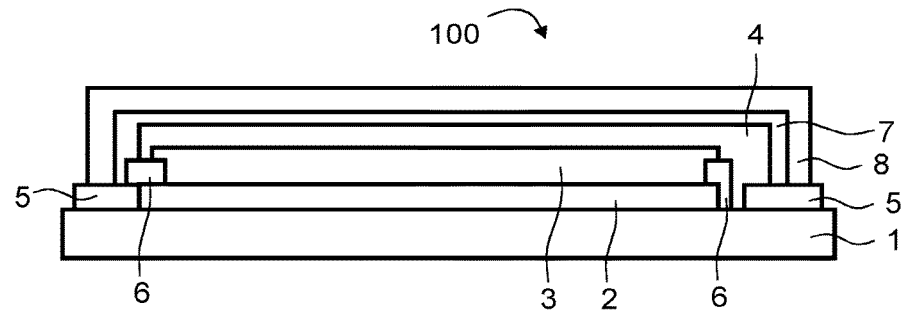
FIG. 1 a schematic representation of an example of a light-emitting component.

In the embodiments and Figures, identical, similar or equivalently operating elements can each be labelled with the same reference numerals. The elements illustrated and their relative proportions are not to be regarded as true to scale; rather, individual elements, such as layers, components, modules and regions, can be represented exaggerated in size for better illustration and/or better comprehension.

In connection with the Figures, embodiments of light-emitting components 100 and methods for producing light-emitting components 100 are described hereafter. The light-emitting components 100 of the embodiments shown in FIGS. 1 to 8 are designed, for example, as organic light-emitting components, while in connection with FIG. 9 an inorganic light-emitting component is described.

FIG. 1 shows the basic structure of an organic light-emitting component 100, which is designed as an organic light-emitting diode (OLED).

The organic light-emitting component 100, which in the following can also be designated as OLED 100, includes a substrate 1, on which between a first electrode 2 and a second electrode 4 a functional layer stack 3 in the form of an organic functional layer stack with at least one light-emitting layer is arranged, so that light is generated in the functional layer stack 3 during the operation of the OLED 100. At least one of the electrodes 2, 4 is designed transparent. Depending on which of the electrodes 2, 4 and possibly other elements of the component 100 are transparent, the light-emitting component 100 emits light during operation through the first electrode 2 and the substrate 1 and/or through the second electrode 4 and the above lying layers or elements.

If the OLED 100 is intended to emit light through the substrate 1, for example, and is designed as a so-called bottom emitter, then the substrate 1 is transparent and designed, for example, in the form of a glass plate or glass layer. Alternatively, the substrate 1 may also include, for example, a transparent plastic or glass-plastic laminate. If necessary, the substrate 1 can be encapsulated with an encapsulation arrangement, which can be arranged between the substrate 1 and the first electrode 2 and/or on the opposite side of the substrate 1 to the first electrode 2.

If the OLED 100 is intended to emit light in the direction facing away from the substrate 1 through the second electrode 4 and is designed as a so-called top emitter, the substrate 1 may also include an opaque material, such as a metal film, if no radiation through the substrate 1 is desired. In this case, the substrate 1 and the first electrode 2 can also be constructed jointly as a metal film.

Thus at least one of the electrodes 2, 4 is therefore transparent and includes as its electrode material, for example, a transparent conducting oxide such as indium tin oxide or aluminum tin oxide. If light is only intended to be emitted through one of the electrodes 2, 4, the other electrode can advantageously be designed to be reflecting and include e.g. a metal such as silver or aluminum.

The electrodes 2, 4 are advantageously formed over a large area and contiguously, so that the OLED 100 can be formed as a light source, in particular as an areal light source. The term "over a large area" can mean here that the organic light-emitting element 100 has an area of greater than or equal to a few square millimeters, advantageously greater than or equal to 1 square centimeter and particularly advantageously greater than or equal to one square decimeter. Alternatively, it is also possible for at least one of the electrodes 2, 4 of the light-emitting component 100 to be structured, which by means of the light-emitting component 100 facilitates a spatially and/or temporally structured and/or variable lighting impression, for example for a structured and/or multi-colored illumination or for a display device.

To provide the electrical contacting of the electrodes 2, 4, as shown in FIG. 1, electrode connection pieces 5 can also be provided, which under the encapsulation arrangement 7 described below pass from the electrodes 2, 4 through to the outside. The electrode connection pieces 5, designed as electrical contact supply lines, can be transparent or non-transparent and may include or be formed of a TCO and/or a metal.

The functional layer stack 3, which in the example shown is designed as an organic functional layer stack, which in addition to the at least one organic light-emitting layer may include other organic layers, for example one or more selected from a hole injection layer, a hole transport layer, an electron blocking layer, a hole blocking layer, an electron transport layer, an electron injection layer and a charge generation layer (CGL), which are suitable for transporting holes or electrons to the organic light-emitting layer or for blocking the respective transport.

In addition, as shown in FIG. 1, insulator layers 6 can be provided, for example having or formed from polyimide, which electrically insulate the electrodes 2, 4 from each other, for example. Depending on the configuration of the individual layers of the OLED 100, insulator layers 6 need not be absolutely essential either and may not be present, for example if appropriate masking processes are used for applying the layers.

An encapsulation arrangement 7 is arranged above the functional layer stack 3 and the electrodes 2, 4, for protecting the functional layer stack 3 and the electrodes 2, 4. The encapsulation arrangement 7 is in this case particularly advantageously implemented as a thin-film encapsulation, which includes at least one or a plurality of encapsulation layers made of one or a plurality of encapsulation materials. The encapsulation layers can be applied, for example, by means of an ALD or MLD process. Suitable materials for the layers of the encapsulation arrangement 7, which can advantageously have a thickness of greater than or equal to one atomic layer and less than or equal to 100 nm, are for example, aluminum oxide, zinc oxide, zirconium oxide (zirconia), titanium oxide, hafnium oxide, lanthanum oxide, and tantalum oxide. Alternatively or in addition to encapsulation layers produced using ALD or MLD, the encapsulation arrangement 7 may also include at least one or a plurality of further layers, i.e. in particular, barrier layers and/or passivization layers, which can be applied by other methods described above in the general section.

Alternatively or in addition to a thin-film encapsulation, the encapsulation arrangement 7 may also include a glass cover, which, for example in the form of a glass substrate having a cavity, is adhesively bonded on the substrate 1 by means of an adhesive layer. A moisture-absorbing material (getter), e.g. made of zeolite, can also be bonded into the cavity, in order to bind moisture, oxygen or other harmful gases which can penetrate through the adhesive. In addition, the adhesive layer for fixing the cover on the substrate can itself also be absorbent for harmful substances, and/or adhesive layer structures can also be present.

In addition, as shown in FIG. 1, on top of the encapsulation arrangement 7, viewed from the substrate 1, a protective layer 8 can also be arranged, which can form a scratch protection layer and which may include, for example, a lacquer, a stuck-on or laminated-on film, a stuck-on or laminated-on glass plate or a combination thereof.

The elements of the OLED 100 may also, additionally or alternatively, include corresponding features of the embodiments described above in the general section.

The light-emitting components 100 described hereafter in connection with the FIGS. 2 to 8 are designed in accordance with the example of FIG. 1, but may also include, in particular as regards the essential structure of the light-emitting component 100, modifications or variations of the structure shown in FIG. 1.

In particular, the features of the basic structure of the organic light-emitting component 100 shown in FIG. 1 are not to be understood as being restrictive for the examples that follow.

Figure 2A:
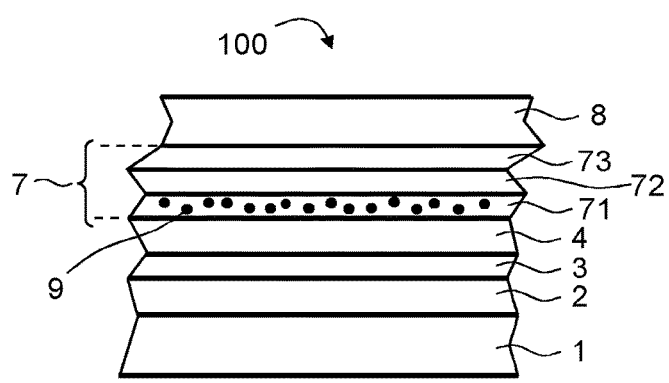
FIGS. 2A to 2C schematic representations of a light-emitting component and a method for producing the light-emitting component according to an embodiment, FIGS. 3A to 3C schematic representations of an encapsulation layer having a wavelength conversion substance in accordance with a further embodiment, and FIGS. 4 to 9 schematic representations of a light-emitting component in accordance with further embodiments.

FIG. 2A shows an embodiment of a light-emitting component 100 which is designed as a top emitter and which in operation emits light through the second electrode 4, the encapsulation arrangement 7 and the protective layer 8. The second electrode 4 and the encapsulation arrangement 7 and, where appropriate, the protective layer 8, are therefore transparent. The substrate 1 can be opaque. It may also be possible for no protective layer 8 to be present. In addition, a film or layer having light-diffusing properties and/or for improving the light extraction, for example in the form of a diffusion or extraction film or layer, can be arranged on the encapsulation arrangement 7 or the protective layer 8.

As an alternative to the embodiment shown, it is also possible for the light-emitting component shown in FIG. 2A 100 to be transparent, and therefore for light also to be emitted through the first electrode 2 and the substrate 1.

The transparent encapsulation arrangement 7 is designed, as described above, as a thin-film encapsulation and includes a plurality of transparent encapsulation layers 71, 72, 73, which include one or a plurality of the above described encapsulation materials. Purely as an example, in the embodiment shown three encapsulation layers 71, 72, 73 are shown, wherein the encapsulation arrangement 7 may also include more or fewer encapsulation layers.

In particular, the encapsulation arrangement 7 in the embodiment shown includes a transparent encapsulation layer 71 containing a wavelength conversion substance 9. In other words, this means that the wavelength conversion substance 9 is embedded in the transparent encapsulation material of the encapsulation layer 71. The further encapsulation layers 72, 73 are also transparent. The wavelength conversion substance 9 can be implemented, for example, in the form of particles or quantum dots and include or be formed from one of the luminescent materials described above in the general section. It is also possible that the wavelength conversion substance 9 includes organic molecules of luminescent material, as described above in the general section.

Due to the encapsulation layer 71 with the embedded wavelength conversion substance 9, the encapsulation arrangement 7 acts at the same time as a wavelength conversion layer and is therefore designed with a dual function, so that a light conversion and color mixing is effected in the encapsulation arrangement 7. This makes it possible, in the case of a light-emitting component 100 designed as a top-emitter, to use a wavelength conversion layer without an additional process step, although the light-emitting component 100 lacks an additionally applied wavelength conversion layer. The wavelength conversion layer used in the embodiment shown is therefore part of the encapsulation arrangement 7, or can alternatively also form the encapsulation arrangement.

Figure 2B:
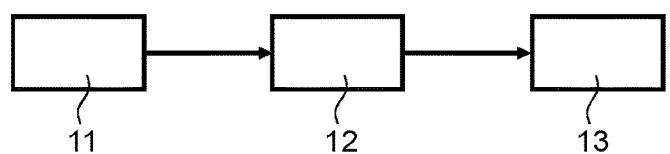

FIG. 2B shows a method for producing the light-emitting component 100 shown in FIG. 2A. In this method, represented by a method step 11, the first electrode 2, above it the functional layer stack 3 and above that the second electrode 4 are applied to the substrate 1. In a further method step 12 the encapsulation arrangement 7 having the at least a encapsulation layer 71, into which the wavelength conversion substance 9 is embedded, is produced. Above this, possibly in a further method step 13, the protective layer 8 and/or one or a plurality of further layers, such as a diffusion or extraction layer, are also applied.

If the encapsulation layers 71, 72, 73 of the encapsulation arrangement 7 are applied by means of ALD or MLD, the encapsulation layers 71, 72, 73, as described above, typically have a thickness of less than or equal to 100 nm. Suitable materials as a wavelength conversion substance 9 therefore, in conjunction with such encapsulation layers, are luminescent materials having a size of less than or equal to 50 nm, for example organic luminescent materials having a typical molecular size of less than 10 nm, or quantum dots with a typical size in the region of 10 nm, so that the wavelength conversion substance 9 can be embedded in the encapsulation material of the encapsulation layer 71. If at least the encapsulation layer 71 is applied, for example using CVD, with a thickness in the region of a few micrometers or more, then suitable materials for a wavelength conversion substance 9 also include particles of inorganic luminescent materials, which can have a typical size in the micrometer range.

Figure 2C:
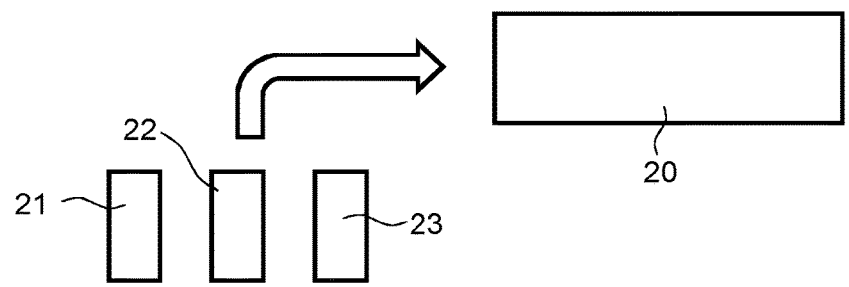

For producing the encapsulation layer 71 with the wavelength conversion substance 9, the latter is embedded in the encapsulation material during the construction of the encapsulation layer 71 using one of the methods described. As shown in FIG. 2C, starting materials 21, 22, 23 (precursors) are provided that are alternately fed to a coating chamber 20. If, for example, $Al_2O_3$ be used as the encapsulation material of the encapsulation layers 71, 72, 73, produced by means of ALD, then trimethyl aluminum (TMA) can be used as the precursor and $H_2O$ can be used as another precursor 22. In addition, as another precursor 23, H2O is provided, for example, which contains the wavelength conversion substance 9. For example, this can be a water-soluble organic luminescent material, such as rhodamine or else a dispersion with quantum dots. Depending on the material to be produced and the solubility of the wavelength conversion substance 9, as an alternative to water another solvent can also be used, such as ethylene glycol.

By varying the sequence of the precursor materials 21, 22, 23 it is possible to selectively control whether an encapsulation layer or partial layer thereof is deposited only from the encapsulation material Al2O3 or from the encapsulation material Al2O3 with embedded wavelength conversion substance 9. If only the precursor materials 21 and 22 are used alternately, a luminescent material-free encapsulation material is formed. By contrast, if the precursor materials 21 and 23 are used, i.e. instead of the precursor material 22 the precursor material 23 which is displaced with the wavelength conversion substance 9, then during the growth of the encapsulation material the wavelength conversion substance 9 is embedded in the growing encapsulation layer. In this case it can be advantageous, for example, in one cycle to deposit a partial layer with wavelength conversion substance 9 and then a plurality of layers without wavelength conversion substance 9, in order to embed the latter in the growing encapsulation layer 71. It can be advantageous under certain circumstances, following the use of the precursor material 23 with the wavelength conversion substance 9 to carry out a cleaning of the coating chamber 20, in order to remove any "loose" particles that may be present.

It can also be advantageous, as shown in FIG. 2A, to apply further luminescent material-free encapsulation layers 72, 73 above the luminescent material-containing encapsulation layer 71.

Instead of providing a precursor material containing the wavelength conversion substance 9, to feed said material into the coating chamber 20 a direct liquid injection method (DLI) can also be used. This can be advantageous, for example, if the precursor materials are in gaseous form. However, when using a DLI method for feeding the wavelength conversion substance 9 it is not necessary for the precursor materials to be provided in gaseous form. For example, in order to produce an encapsulation layer with silicon nitride as the encapsulation material, SiH4 can be used as the precursor material 21 and NH3 as a further precursor material 22. These can be grown by means of an ALD process, by means of an MLD process, by means of a CVD process or by means of another suitable deposition process. In addition to the process gases, i.e. the precursor materials 21, 22 and possibly other gases that are required for the deposition process, as a further precursor material 23 a gas stream having a carrier gas and the wavelength conversion substance 9 can be directed into the coating chamber 20 through an additional conduit using a DLI system. As a carrier gas, for example, helium can be used. This enables an encapsulation layer to be produced, having silicon nitride as the encapsulation material and a wavelength conversion substance 9 embedded therein.

For the DLI process, it is necessary to convert the wavelength conversion substance 9 into a gas phase, so that the latter can be transported into the coating chamber 20 with the carrier gas stream. Many organic luminescent substances are capable of being vaporized for this purpose, whereas quantum dots and particles of inorganic luminescent materials can be atomized, for example using a spraying process, and thus converted into the gas phase.

As already previously described, it can be advantageous to deposit a partial layer with the wavelength conversion substance 9 and a plurality of sub-layers thereon without the wavelength conversion substance 9, in order to embed the wavelength conversion substance 9 into the growing encapsulation material. In addition, under certain circumstances it may be advantageous after the deposition of the wavelength conversion substance 9 to carry out a cleaning of the coating chamber 20, in order to remove any "loose" particles of the wavelength conversion substance 9 from the coating chamber 20.

Figure 3A:
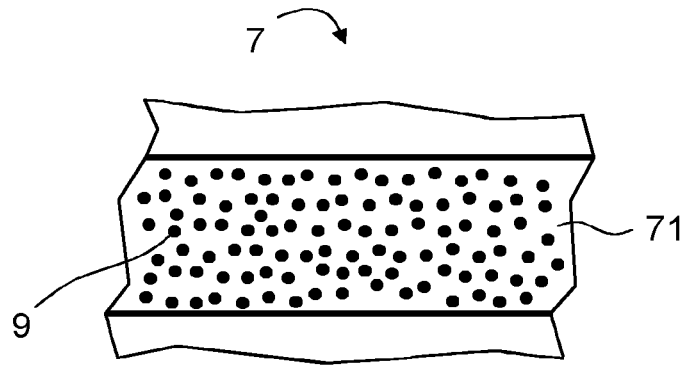
Figure 3B:
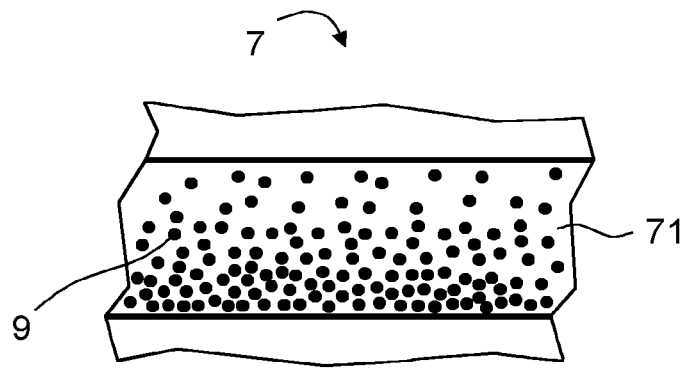
Figure 3C:
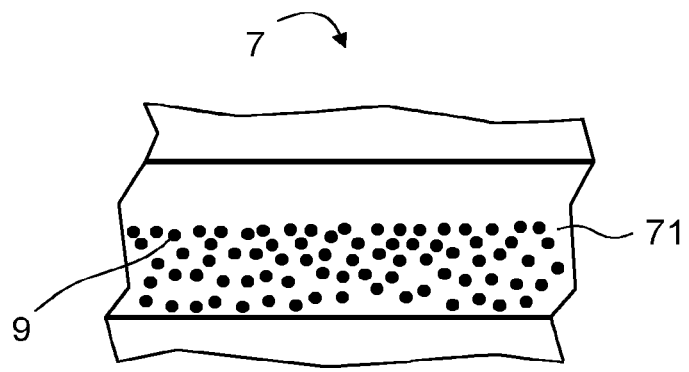

In connection with the FIGS. 3A to 3C, embodiments for concentration distributions of the wavelength conversion substance 9 are shown, purely as examples, in connection with the encapsulation layer 71. In this way the wavelength conversion substance 9, for example, as shown in FIG. 3A, can be homogeneously distributed. Such a homogenous or quasi-homogenous distribution of the converter material can be obtained by recurrent pulses during the feeding of the precursor material 23 with the wavelength conversion substance 9. The wavelength conversion substance 9 may advantageously include a concentration of less than or equal to 50 vol % relative to the total layer volume. Such a concentration may be advantageous, in particular, in connection with layers produced by means of ALD or MLD.

By varying the pulse rate while feeding the precursor material with the wavelength conversion substance 9, different concentration gradients of the wavelength conversion substance 9 can be produced in the growing layer. For example, by reducing the pulse rate a concentration gradient can be created, as shown in FIG. 3B. Such a concentration gradient can be advantageous in terms of the encapsulation effect and also in terms of the conversion efficiency.

In a final phase during the production of a layer with a wavelength conversion substance 9, it is also possible not to use any precursor material with the wavelength conversion substance 9, so that the produced layer includes a partial layer with the wavelength conversion substance 9 and a further partial layer without the wavelength conversion substance 9. Such an arrangement of the wavelength conversion substance 9, which can also be understood as a limiting case of the concentration gradient in FIG. 3B, for example in the encapsulation layer 71 can improve the encapsulation effect in two respects: on the one hand, it can ensure that the entire wavelength conversion substance 9 is covered by pure encapsulation material, so that no luminescent material potentially lies unprotected on a surface of the encapsulation layer 71. On the other hand it can be used to ensure that the external part of the encapsulation layer 71, facing away from the functional layer stack 3, is present as a pure encapsulation material. If the encapsulation effect is adversely affected by the addition of the wavelength conversion substance 9, then this pure encapsulation material can continue to provide a strong encapsulation effect.

The concentration distributions of the wavelength conversion substance 9 shown in connection with FIGS. 3A to 3C are not limited only to encapsulation layers, but can also be used in conjunction with electrodes into which a wavelength conversion substance 9 is embedded.

Figure 4:
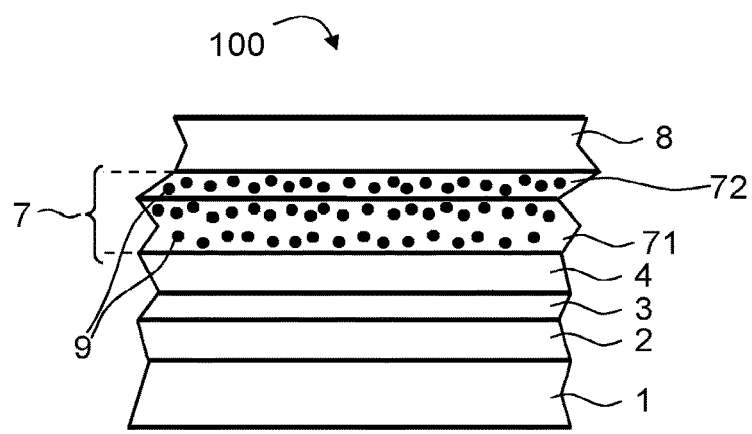

FIG. 4 shows a further embodiment of a light-emitting component 100, which in comparison to the previous embodiment includes an encapsulation arrangement 7 having a plurality of encapsulation layers 71, 72 with embedded wavelength conversion substance 9. Purely by way of examples, two encapsulation layers 71, 72 are shown that contain a wavelength conversion substance 9.

For example, the encapsulation layer 71 can be a CVD-produced layer having an inorganic luminescent material as the wavelength conversion substance 9, which is fed using a DLI method during the production of the layer, while the encapsulation layer 72 may be an encapsulation layer produced using ALD or MLD with an organic luminescent substance as the wavelength conversion substance 9. Due to the combination of a plurality of encapsulation layers with different wavelength conversion substances 9 a plurality of different wavelength ranges can easily be converted.

As an alternative to the example shown, it is also possible that more than two encapsulation layers or even all of the encapsulation layers of an encapsulation arrangement contain a wavelength conversion substance 9. The encapsulation layers containing the wavelength conversion substance 9 may include the same encapsulation material or different encapsulation materials and also the same or different luminescent substances as the wavelength conversion substance 9. The encapsulation layers 71, 72 with the wavelength conversion substance 9, as shown in FIG. 4, can be arranged directly on top of each other. It is also possible that encapsulation layers without wavelength conversion substance 9 are arranged between encapsulation layers with a wavelength conversion substance 9.

Figure 5:
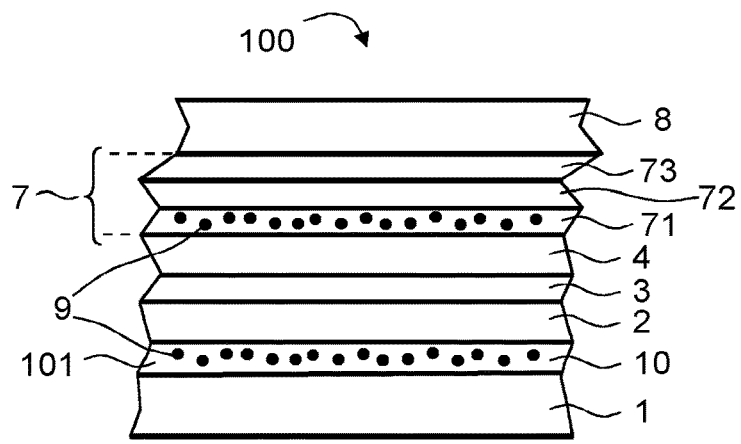

FIG. 5 shows a light-emitting component 100 according to a further embodiment, which in comparison with the embodiment of FIG. 2A is designed as a transparent OLED and thus as a two-sided light-emitting element 100. In particular, the light-emitting component 100 of the embodiment of FIG. 5 can be designed as a flexible component that includes, for example, a plastic substrate 1. For encapsulating the electrodes 2, 4 and the functional layer stack 3 from the substrate side, the light-emitting component 100 of the embodiment shown includes a further encapsulation arrangement 10 having at least one encapsulation layer 101, into which the wavelength conversion substance 9 can be embedded. In particular, the encapsulation arrangement 10 has features which are described in connection with the encapsulation arrangement 7 and the encapsulation layers thereof. In the transparent, flexible component 100 of FIG. 5 therefore, a light extraction and light conversion is possible on both sides using the dual-function encapsulation layers 7, 10.

Figure 6:
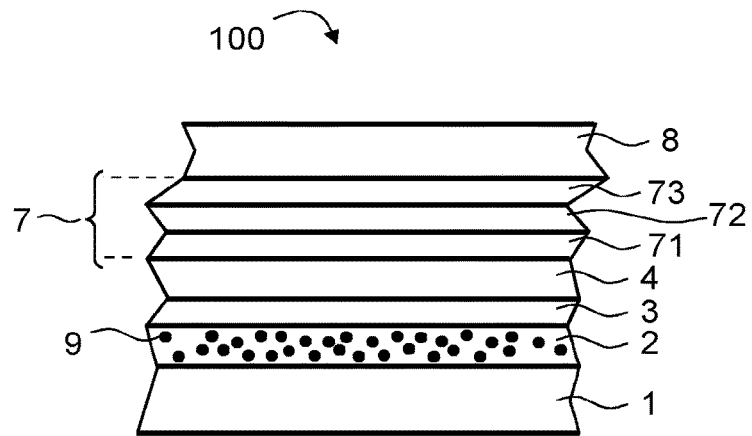

FIG. 6 shows a light-emitting component 100 according to a further embodiment, which in comparison to the previous embodiments of FIGS. 2A, 3 and 4 is designed as a pure bottom emitter. Accordingly, in the light-emitting component 100 of FIG. 6 the first electrode 2 and the substrate 1 are transparent. The second electrode 4 can be designed, for example, to be reflective.

The first electrode 2 includes as the functional material a transparent electrode material such as a TCO, for example indium tin oxide or aluminum tin oxide, in which a wavelength conversion substance 9 is embedded. This enables the conductive first electrode 2 to be used as a wavelength conversion layer at the same time. The functionality of a wavelength conversion layer and an electrode are therefore combined in a single dual-function layer. The wavelength conversion substance 9 can be designed as described in connection with the previous embodiments. In addition, it is possible for the first electrode 2 with the wavelength conversion substance 9 to be produced in accordance with one of the above methods described in relation to the encapsulation arrangement.

Figure 7:
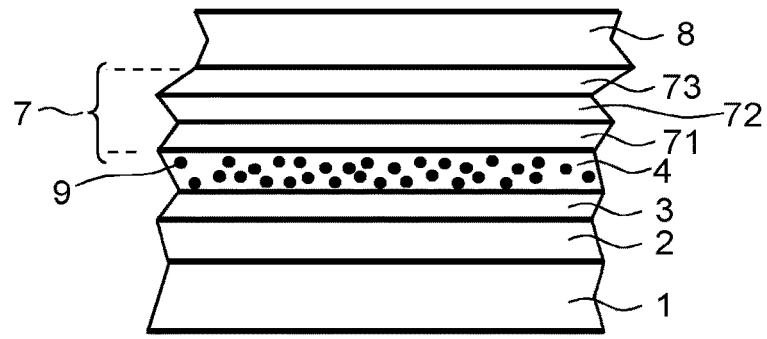

FIG. 7 shows a light-emitting component 100 according to a further embodiment, which in comparison to the embodiment of FIG. 6 is designed as a top emitter and includes a wavelength conversion substance 9 in the electrode material of the second electrode 4.

Figure 8:
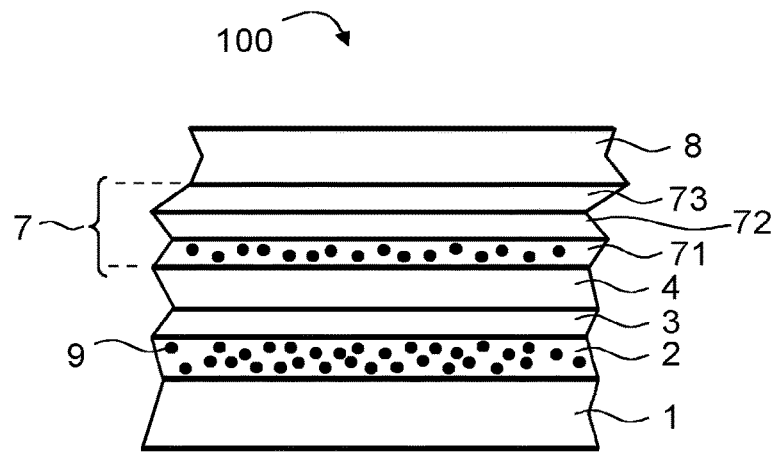

FIG. 8 shows a further embodiment, in which the light-emitting component 100 is transparent and which includes a wavelength conversion substance 9 both in the first electrode 2 and in the encapsulation location 7.

Figure 9:
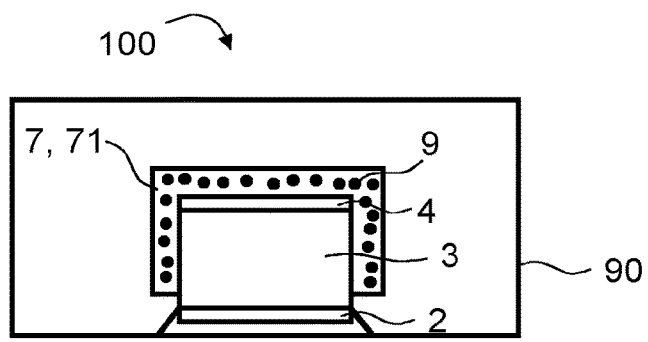

FIG. 9 shows a further embodiment of a light-emitting component 100, designed as an inorganic light-emitting component and including a functional layer sequence 3 in the form of an inorganic semiconductor layer sequence. In particular, the semiconductor layer sequence can be designed with the electrodes 2, 4 as a light-emitting semiconductor chip, which can be arranged for example in a package 90, i.e. perhaps a housing with or without encapsulation. On the semiconductor chip an encapsulation arrangement 7 with at least one encapsulation layer 71 is applied, into which a wavelength conversion substance 9 is embedded. The encapsulation arrangement 7 protects the wavelength conversion substance against harmful environmental influences. The encapsulation arrangement 7 can be designed as described in connection with the previous embodiments.

By embedding the wavelength conversion substance 9 in the encapsulation arrangement 7, which can be applied at the wafer, chip or package level, it is possible to use sensitive luminescent materials such as quantum dots also in conjunction with common packages, for which standard processes, such as a volume conversion in the encapsulation compound or an unprotected conversion layer on the chip, are typically not applicable.

The embodiments described in connection with the Figures and their individual features, can in accordance with other embodiments be combined with each other, even if such combinations are not explicitly described in connection with the Figures. In addition, the embodiments described in connection with the Figures may also include additional or alternative features in accordance with the general section of the description.

The present disclosure is not limited to the embodiments by the fact that the description is based on them. Rather, the present disclosure includes each new feature, as well as any combination of features, which includes in particular every combination of features in the patent claims, even if this feature or this combination itself is not explicitly specified in the patent claims or embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting component, comprising
    a functional layer stack having at least one light-emitting layer which is set up to generate light during the operation of the component,
    a first electrode and a second electrode, which are set up to inject charge carriers into the functional layer stack during operation, and
    an encapsulation arrangement having encapsulation material, which is arranged above at least one of the electrodes and the functional layer stack, wherein
- at least one of the electrodes is transparent and embedding a wavelength conversion substance, in which the wavelength conversion substance is embedded so that the wavelength conversion substance has a concentration gradient within the at least one electrode.

2. The component as claimed in claim 1,
- wherein the encapsulation arrangement is designed as a thin film encapsulation having at least one encapsulation layer made of an oxide, nitride or oxinitride as an encapsulation material and the wavelength conversion substance is embedded in the encapsulation material of the at least one encapsulation layer.

3. The component as claimed in claim 1,
- wherein the light-emitting component is designed as an organic light-emitting component in which the functional layer stack is designed as an organic functional layer stack having at least one organic light-emitting layer and which comprises the first electrode on a substrate, the functional layer stack above the substrate, the second electrode above that and the encapsulation arrangement above that.

4. The component as claimed in claim 3,
- wherein the light-emitting component comprises a further encapsulation arrangement between the substrate and the first electrode, which comprises a wavelength conversion substance in an encapsulation material.

5. The component as claimed in claim 1,
- in which the light-emitting component is designed as an inorganic light-emitting component, in which the functional layer stack is designed as an inorganic semiconductor layer sequence having at least one light-emitting layer.

6. The component as claimed in claim 1,
- wherein the first electrode is transparent and contains a wavelength conversion substance.

7. The method as claimed in claim 1,
- wherein the wavelength conversion substance is embedded so that at least one electrode includes a partial layer with the wavelength conversion substance and further includes a partial layer without the wavelength conversion substance.

8. A method for producing a light-emitting component comprising,
- providing a functional layer stack having at least one light-emitting layer which is set up to generate light during the operation of the component,
- providing a first electrode and a second electrode, which are set up to inject charge carriers into the functional layer stack during operation, and
- providing an encapsulation arrangement having encapsulation material, which is arranged above at least one of the electrodes and the functional layer stack, the encapsulation arrangement comprising a plurality of the encapsulation layers, in which a wavelength conversion substance is embedded so that the wavelength conversion substance has a concentration gradient within the encapsulation arrangement,
- wherein at least one of the electrodes is transparent and embedding a wavelength conversion substance and/or the encapsulation material is transparent and embedding a wavelength conversion substance,
- in which during the construction of at least one transparent electrode, the wavelength conversion substance is embedded into a functional material of the layer, in which the wavelength conversion substance is embedded so that the wavelength conversion substance has a concentration gradient within the at least one electrode.

9. The method as claimed in claim 8,
- in which the layer is produced together with the embedded wavelength conversion substance by using an atomic layer deposition method, a molecular layer deposition method or a chemical vapor phase deposition method.

10. The method as claimed in claim 8,
- in which for producing the layer having the wavelength conversion substance, the wavelength conversion substance is fed together with at least one precursor material to a coating chamber, in which the layer having the wavelength conversion substance is produced.

11. The method as claimed in claim 10,
- in which the wavelength conversion substance is fed to the coating chamber by means of a direct fluid injection method.

12. The method as claimed in claim 8,
- wherein during the construction of two or more transparent layers selected from at least one of the electrodes and/or an encapsulation layer of the encapsulation arrangement, the wavelength conversion substance is embedded into a functional material of the layer.

13. The component as claimed in claim 8,
- wherein the wavelength conversion substance is embedded so that at least one electrode includes a partial layer with the wavelength conversion substance and further includes a partial layer without the wavelength conversion substance.

* * * * *